United States Patent
Reykowski

(10) Patent No.: US 9,869,732 B2
(45) Date of Patent: Jan. 16, 2018

(54) AUTOMATED DECOUPLING OF RF RECEIVE COIL ELEMENTS

(71) Applicant: KONINKLIJKE PHILIPS N.V., Eindhoven (NL)

(72) Inventor: Arne Reykowski, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 400 days.

(21) Appl. No.: 14/653,881

(22) PCT Filed: Sep. 24, 2013

(86) PCT No.: PCT/IB2013/058793
§ 371 (c)(1),
(2) Date: Jun. 19, 2015

(87) PCT Pub. No.: WO2014/096997
PCT Pub. Date: Jun. 26, 2014

(65) Prior Publication Data
US 2015/0346295 A1     Dec. 3, 2015

Related U.S. Application Data

(60) Provisional application No. 61/739,806, filed on Dec. 20, 2012.

(51) Int. Cl.
| | | |
|---|---|---|
| G01R 33/36 | (2006.01) | |
| G01R 33/34 | (2006.01) | |
| G01R 33/3415 | (2006.01) | |

(52) U.S. Cl.
CPC ..... *G01R 33/365* (2013.01); *G01R 33/34092* (2013.01); *G01R 33/3614* (2013.01); *G01R 33/3415* (2013.01)

(58) Field of Classification Search
CPC combination set(s) only.
See application file for complete search history.

(56) References Cited

U.S. PATENT DOCUMENTS

| | | | |
|---|---|---|---|
| 4,855,680 A | 8/1989 | Arakawa et al. | |
| 5,144,244 A | 9/1992 | Kess | |
| 5,610,520 A | 3/1997 | Misic | |
| 5,629,624 A * | 5/1997 | Carlson | G01R 33/38 324/307 |
| 6,639,406 B1 | 10/2003 | Boskamp et al. | |
| 7,560,934 B1 | 7/2009 | Chmielewski et al. | |
| 2007/0273377 A1 | 11/2007 | Yang | |

FOREIGN PATENT DOCUMENTS

| | | |
|---|---|---|
| WO | 2005083458 | 9/2005 |
| WO | 2011148278 | 12/2011 |

\* cited by examiner

*Primary Examiner* — Vincent Q Nguyen

(57) ABSTRACT

The invention discloses a decoupling circuit (32) disposed between adjacent RF receive coil elements to automatically decouple the adjacent MRI RF receive coil elements. In one embodiment, the invention involves to inject an RF signal into a first coil element, to measure the RF signal coupled from the first coil element into a second coil element and to adjust the capacitance of the decoupling circuit such as to minimize the coupling between the first and the second coil elements.

18 Claims, 4 Drawing Sheets

AUTOMATED DECOUPLING OF RF RECEIVE COIL ELEMENTS

CROSS-REFERENCE TO PRIOR APPLICATIONS

This application is the U.S. National Phase application under 35 U.S.C. §371 of International Application No. PCT/IB2013/058793, filed on Sep. 24, 2013, which claims the benefit of U.S. Patent Application No. 61/739,806, filed on Dec. 20, 2012. These applications are hereby incorporated by reference herein.

The present application relates to the medical arts, magnetic resonance arts, and related arts. The present application finds particular application in an arrangement to detune magnetic resonance (MR) receive coils in a magnetic resonance imaging (MRI) or a magnetic resonance spectroscopy (MRS) system. However, it is to be understood that it also finds application in other applications, and is not necessarily limited to the aforementioned application.

MR devices apply a main magnetic field through an examination region during the examination and/or treatment of patients. This strong field, typically denoted $B_0$, acts to align the nuclear spins of the body tissue within a patient to be examined. In some MR devices, the $B_0$ field is horizontally oriented, and in others it is vertically oriented. In both horizontally and vertically oriented systems, magnetic resonance is excited in the aligned nuclear spins by a relatively strong orthogonal radio frequency (RF) field, typically denoted $B_1$. The $B_1$ field causes the aligned nuclear spins to tip into a plane orthogonal to the static magnetic field $B_0$. The spins process back into alignment with the $B_0$ field emitting relatively weak RF magnetic resonance signals as the nuclear spins relax. This resonance is detected by RF coils tuned to the specific resonance frequency. These resonance signals are passed to processing equipment to reconstruct the signals into an image representation or derive spectroscopy information. Typically, the transmitted RF magnetic excitation signals are orders of magnitude larger than the received magnetic resonance signals generated by the relaxing nuclear spins detected by the RF receive coils.

To maintain patient safety and to protect the sensitive receiver equipment, coil elements are decoupled either by design or by carefully compensating mutual coupling during the manufacturing process. However, in MRI, mutual coupling between RF coil elements lead to deterioration in image quality compared to perfectly decoupled RF receive coil elements. Further, in flexible or adjustable RF coil arrays, the mutual coupling between coil elements can vary from patient to patient. For example, in a breast coil, the two side coil elements are movable toward and away from a center coil element. When these coil elements are moved, the mutual inductance or coupling between the coil elements is changed. It is therefore desirable to have the ability to decouple coil elements on a patient by patient basis.

The present application provides a new and improved arrangement to detune magnetic resonance imaging (MRI) coils in an MRI system which overcomes the above-referenced problems and others.

In accordance with one aspect, a magnetic resonance system is provided. The magnetic resonance system including a magnet which generates a static magnetic field in an examination region. A RF transmitter and a RF transmit coil generates RF pulses at a magnetic frequency to excite and manipulate resonance in the examination region. At least one RF receive coil assembly including a plurality of RF receive coil elements configured to acquire magnetic resonance data from the examination region. At least one RF receiver connected to the at least one RF coil assembly. A detuning circuit disposed between adjacent RF receive coil elements to automatically decouple the adjacent RF receive coil elements. A scan controller configured to control the RF transmitter and RF receiver.

In accordance with another aspect, a system for automated decoupling of coil elements is provided. The including a first and second coil elements configured to acquire magnetic resonance data from a magnetic resonance system and a detuning circuit disposed between adjacent RF receive coil elements to automatically decouple the adjacent RF receive coil elements.

In accordance with another aspect, a method for automated decoupling of coil elements is provided. The method including injecting a first signal into a first coil element, measuring the signal coupled from the first coil element into a second coil element, and adjusting a decoupling circuit to minimize the coupling between the first and second coil elements.

One advantage resides in increased patient and equipment safety.

Another advantage resides in the ability to decouple coil elements on a patient by patient basis.

Another advantage resides in the ability to adjust the decoupling of coil elements of any type.

Another advantage resides in inductive coupling/decoupling automatically based on an interactive measurement.

Still further advantages of the present invention will be appreciated to those of ordinary skill in the art upon reading and understanding the following detailed description.

The invention may take form in various components and arrangements of components, and in various steps and arrangements of steps. The drawings are only for purposes of illustrating the preferred embodiments and are not to be construed as limiting the invention.

Figure 1:
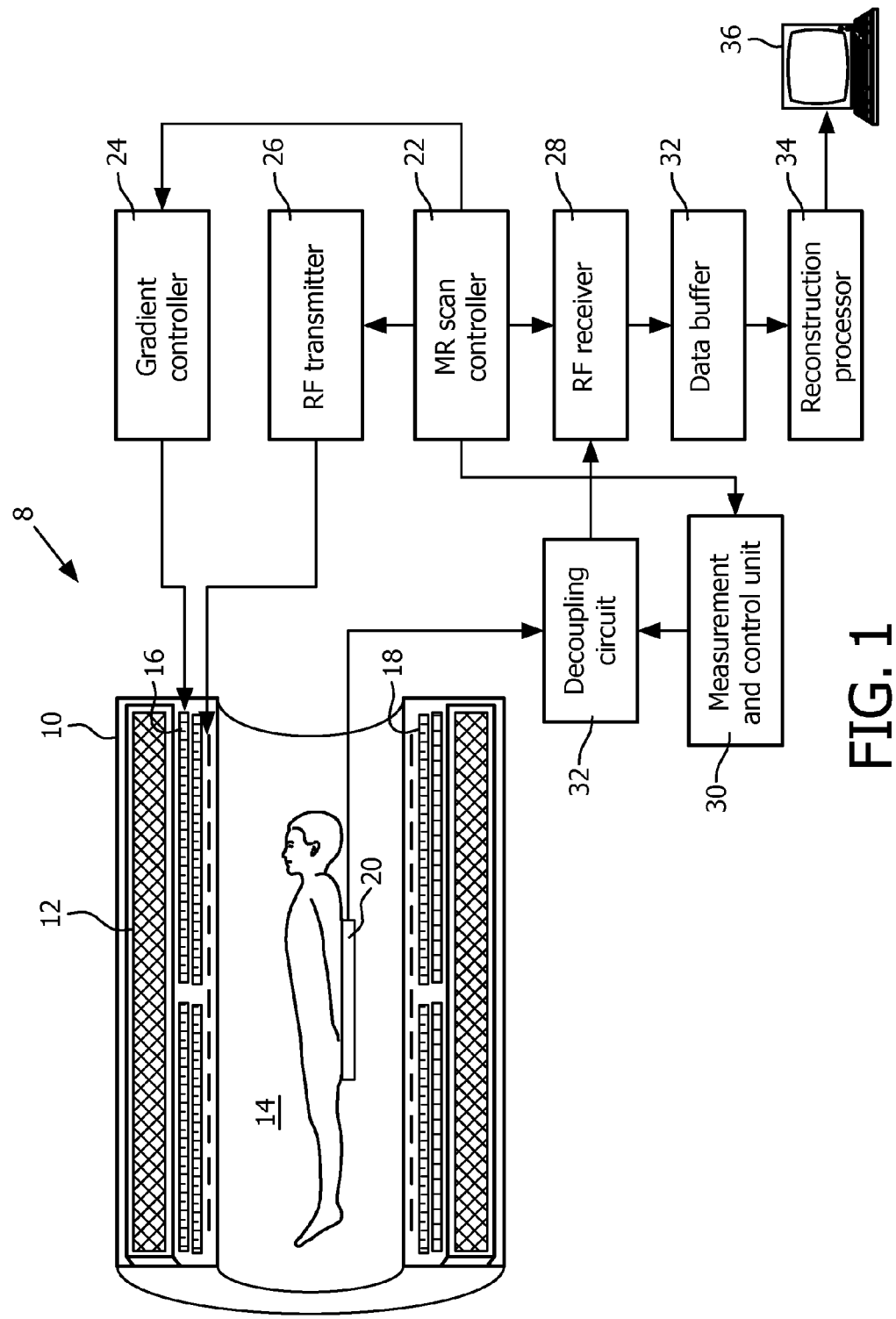
FIG. 1 is a diagrammatic illustration of a magnetic resonance imaging system in accordance with the present application.

FIG. 1 illustrates a magnetic resonance (MR) system 8 including an arrangement for the automated decoupling of coil elements. Specifically, a signal is induced in one of the coil elements, such as with a signal generator and a small RF probe disposed adjacent the coil element. If the other coil element is fully decoupled, the induced signal is not received at the output of the coil amplifier. If the induced signal is received at the output of the coil amplifier, the coil elements are coupled and the decoupling circuit disposed between the coils is adjusted. For example, a varacter diode disposed between coil elements adjusts its capacitance based on applied signals to remove the mutual inductance or coupling. Specifically, the varacter diode is adjusted until the output from the other coil is minimized or removed. This process is then repeated each time the coils are moved to ensure that they are fully decoupled. This technique is also applicable to flexible coils whose mutual inductance may vary with the size of the region of the patient to which they are attached. Further, this technique may also be used to adjust for changes in inductive coupling due to loading, such as each time a different patient is introduced. In this manner, the inductive coupling/decoupling is automatically adjusted based on an interactive measurement, without any a priori information.

With reference to FIG. 1, a MR scanner 10 includes a main magnet 12 which generates a temporally uniform $B_0$ field through an examination region 14. The main magnet 12 can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially or otherwise encoding the induced magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

A radio-frequency (RF) excitation coil assembly 18, such as a whole-body radio frequency coil, is disposed adjacent the examination region 14. The RF coil assembly 18 generates radio frequency pulses for exciting magnetic resonance in dipoles of the subject. A RF receive coil assembly 20 can also serve to detect magnetic resonance signals emanating from the examination region 14. Specifically, local, surface, or in-vivo RF receive coils are provided in addition to the whole-body RF coil for more sensitive, localized spatial reception of magnetic resonance signals. In one embodiment, the RF receive coil assembly 20 includes flexible or adjustable coil arrays. In one example, the RF receive coil assembly 20 includes two receive coil array elements which are movable toward and away from a center receive coil element. In another example, the RF receive coil assembly 20 is a breast coil which includes lateral imaging and intervention coil devices which move along an angled portion on edges of the patient support and a medial coil device which remains stationary on or moves along a central straight portion of the patient support thus enabling immobilization an anatomical region during imaging and interventional procedures. When the coil elements of the RF receive coil assembly 20 are moved, the mutual inductance or coupling between the coil elements is changed and requires decoupling.

To acquire magnetic resonance data of a subject, the subject is placed inside the examination region 14, preferably at or near an isocenter of the main magnetic field. A scan controller 22 controls a gradient controller 24 which causes the gradient coils 16 to apply the selected magnetic field gradient pulses across the examination region 14, as may be appropriate to a selected magnetic resonance imaging or spectroscopy sequence. The scan controller 22 also controls an RF transmitter 26 which is connected to the RF transmit coil assembly 18 to generate magnetic resonance excitation and manipulation $B_1$ pulses. The scan controller 22 also controls an RF receiver 28 which is connected to the RF receive coil assembly 20 to receive the generated magnetic resonance signals therefrom. The scan controller 22 also controls a measurement and control unit 30 and a decoupling circuit 32 to adjust the decoupling of the receive coil elements as explained in greater detail below.

The received data from the RF receiver 28 is temporarily stored in a data buffer 32 and processed by a magnetic resonance data processor 34. The magnetic resonance data processor 34 can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface 36 includes a user input device which a clinician can use for controlling the scan controller 22 to select scanning sequences and protocols, display MR data, and the like and a display device which displays reconstructed images and other readouts.

The RF transmit coil assembly 18 includes one or more dedicated transmit coils, each connected to the RF transmitter 26 respectively. In embodiments with a plurality of transmit coil elements, the RF transmitter 26 includes multiple channels, each connected to at least one transmit coil, which collectively generates the resonance excitation and manipulation $B_1$ pulses in the transmit coils. In embodiments with a plurality of receive coil elements, the RF receiver 28 includes multiple channels, each connected to at one or more receive RF receive coil elements 20, which receive the generated magnetic resonance signals. It should be appreciated that in a multi coil embodiment, different groups of coils can be used to excite resonance while the remaining coils are used to receive the resonance signals. Ideally, the transmit coils and receive coils should be completely isolated. During the excitation phase, currents tend to be induced in the receive coils which are constructed for receiving the induced resonance signals which are the same frequency as the excitation RF pulses. Induced currents as the resonance frequency in the receive coils, in turn, generate RF fields as the resonance frequency that oppose the transmitted excitation and manipulation $B_1$ pulses locally near the receive coils. Furthermore, the induced currents can not only damage sensitive receive coils and the receivers but also pose a threat to the subject's safety.

The measurement and control unit 30 measures the mutual inductance or coupling between RF receive coil elements 20. In flexible or adjustable RF receive coils elements, the coupling between coil elements can vary from patient to patient. For example, in a breast coil, the two side coil elements are movable toward and away from a center coil element. When these coil elements are moved, the mutual inductance or coupling between the coil elements is changed. It is therefore desirable to decouple coil elements on a patient by patient basis. Specifically, the measurement and control unit 30 controls a signal generator to induce a signal in one of the RF receive coil elements. In one embodiment, the signal is an RF signal. In other embodiments, the signal is a light signal transmitted by fiber optic cable and the like. The measurement and control unit 30 measures the output of the coil amplifier of the other RF receive coil elements to determine if the induced signal was received. If the other RF receive coil element is fully decoupled, the induced signal is not received at the output of the coil amplifier. If the induced signal is received at the output of the other RF receive coil amplifier, the RF receive coil elements are coupled and the measurement control unit 30 adjusts the decoupling circuit 32 disposed between the coils. Specifically, the measurement and control unit 30 adjusts the decoupling circuit 32 until the output from the other RF receive coil element is minimized or removed. In one embodiment, the mutual inductance or coupling is removed or minimized by overlapping the RF receive coil elements 20 or using a mutual capacitance to cancel the mutual inductance. This process is then repeated each time the coils are moved to ensure that they are fully decoupled. In one embodiment, the measurement and control unit 30 is controlled and initiated by the scan controller 22. In another embodiment, the measurement and control unit 30 is controlled and initiated manually. It should also be appreciated that the measurement and control unit 30 perform the functionality above between scans, patients, scanner configurations, and the like.

For example, after a scan is completed or after RF receive coil elements 20 are moved, the scan controller 22 instructs the measurement and control unit 20 to measure the mutual inductance or coupling between the RF receive coil elements 20. The measurement and control unit 30 controls a signal generator to induce a signal in one of the RF receive coil elements. The measurement and control unit 30 measures the output of a coil amplifier of the other RF receive coil elements to determine if the induced signal was received. The measurement and control unit 30 then compares the received signal at the output of the coil amplifier to a predetermined threshold to determine if the mutual inductance or coupling of the RF receive coil elements is within an acceptable range. If the mutual inductance or coupling of the RF is outside the predetermined threshold, the measurement and control unit 30 adjusts the decoupling circuit 32 until the output from the other RF receive coil element is minimized or removed. The scan controller 22 repeats this process after each scan or after the RF receive coil elements 20 are moved.

Figure 2:
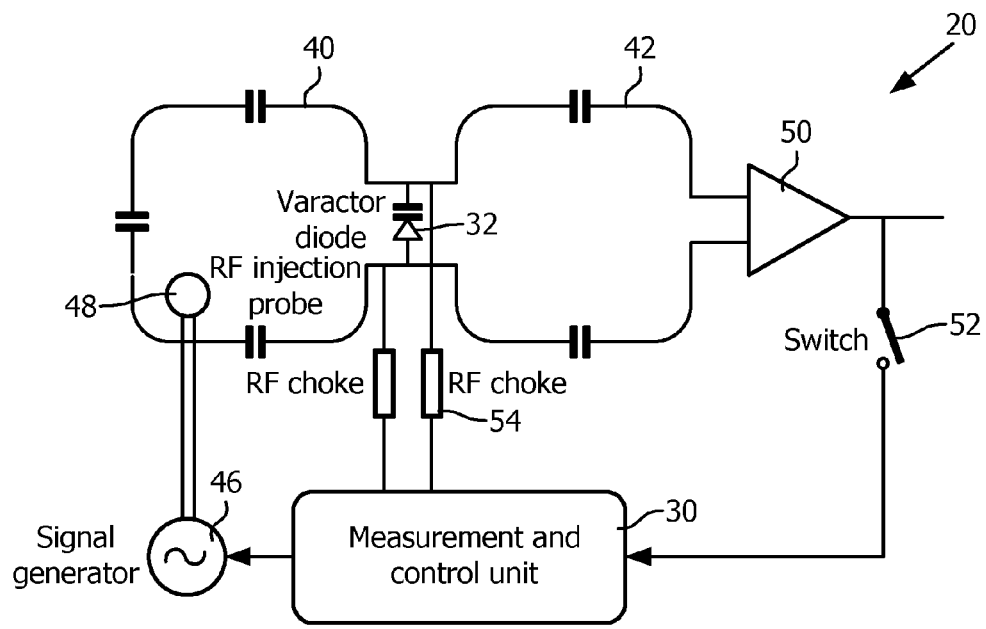
FIG. 2 is a schematic diagram of a RF receive coil assembly in accordance with the present application.

With reference to FIG. 2, a RF receive coil assembly 20 includes a plurality of receive coils 40, 42 which are diagrammatically illustrated. Each receive coil includes a coil segment, e.g. a loop coil, that is tuned to the resonance frequency. A decoupling circuit, e.g. a varactor diode 32, is disposed and connect receive coils 40, 42. Varactor diode 32 provides the capacitance decoupling which is utilized to minimize or remove the mutual inductance or coupling from the RF receive coil assembly 20. To provide the proper capacitance decoupling, the measurement and control unit 30 controls a signal generator 46 to provide a signal through RF injection probe 48 through receive coil 40. The measurement and control unit 30 measures the output of an output amplifier 50 which amplifies the signal received from the receive coil 42. If the receive coil 42 is fully decoupled, the induced signal is not received at the output of the coil amplifier 50. If the induced signal is received at the output of the coil amplifier 50, receive coils 40, 42 are coupled and the measurement control unit 30 adjusts the varactor diode 32 disposed between the coils. To accomplish this, the measurement and control unit 30 adjusts the voltage of the varactor diode 32 until the output received at the output of the coil amplifier 50 is minimized or removed. The RF receive coil assembly 20 includes a switch 52 to protect the RF receiver 28 during the measurement process. Because voltage is being fed to the varactor diode 32, the RF receive coil assembly 20 further includes RF chokes 54 between the varactor diode 32 and the measurement and control unit 30 to remove any RF signals from the voltage being fed. During imaging, it should be appreciated that the voltage supply to the varactor diode 32 is kept constant in order to decouple receive coils 40, 42. While receive coil 40 was illustrated as being induced with the RF signal and receive coil 42 was illustrated as measuring the output from the induced signal, it should be appreciated that each of these receive coils have a symmetric relationship and can be switched.

Figure 3:
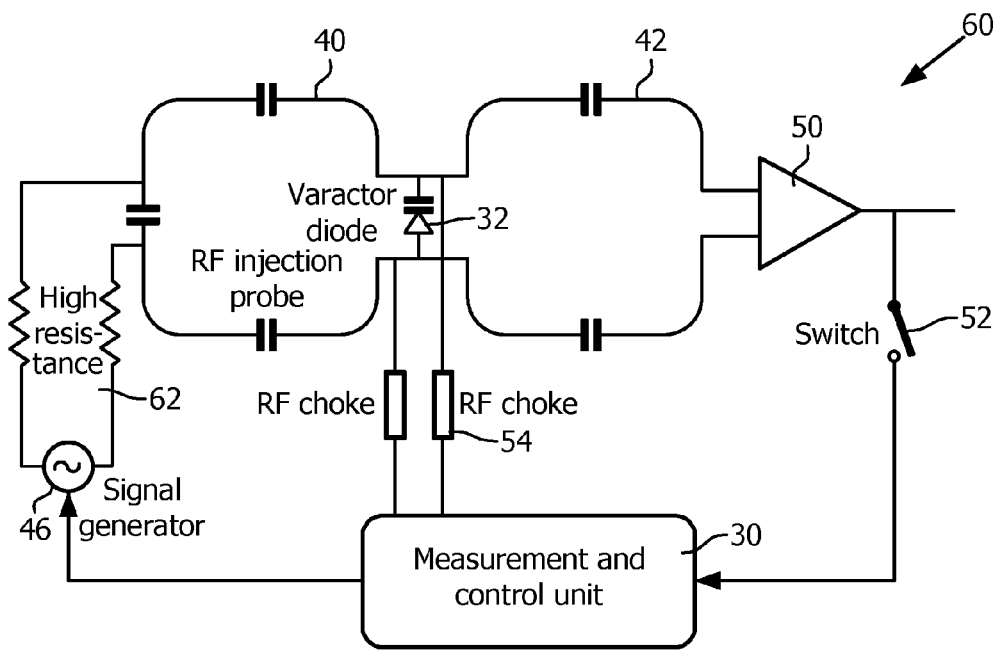
FIG. 3 is a schematic diagram of another embodiment of a RF receive coil assembly in accordance with the present application.

With reference to FIG. 3, another embodiment of a RF receive coil assembly 60 includes a plurality of receive coils 40, 42 which are diagrammatically illustrated. A decoupling circuit, e.g. a varactor diode 32, is disposed and connect receive coils 40, 42. The varactor diode 32 provides the capacitance decoupling which is utilized to minimize or remove the mutual inductance or coupling from the RF receive coil assembly 20. To provide the proper capacitance decoupling, the measurement and control unit 30 controls a signal generator 46 to provide a signal through a high resistance network 62 to receive coil 40. The measurement and control unit 30 measures the output of an output amplifier 50 which amplifies the signal received from the receive coil 42. The RF receive coil assembly 20 includes a switch 52 to protect the RF receiver 28 during the measurement process. The RF receive coil assembly 20 further includes RF chokes 54 between the varactor diode 32 and the measurement and control unit 30 to remove any RF signals from the voltage being fed.

Figure 4:
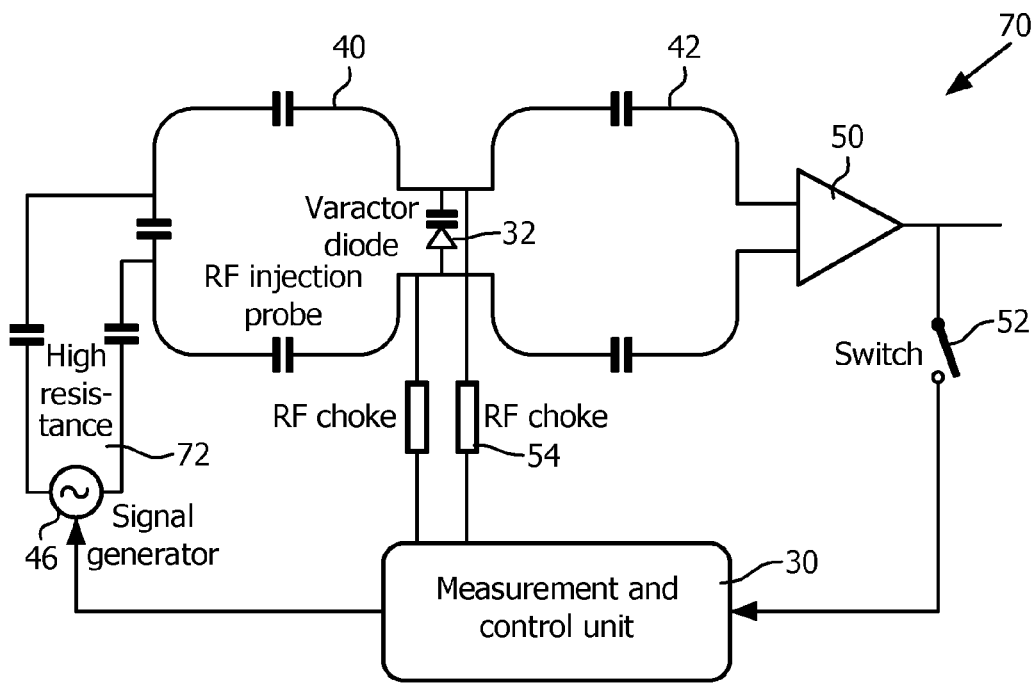
FIG. 4 is a schematic diagram of another embodiment of a RF receive coil assembly in accordance with the present application.

With reference to FIG. 4, another embodiment of a RF receive coil assembly 70 includes a plurality of receive coils 40, 42 which are diagrammatically illustrated. A decoupling circuit, e.g. a varactor diode 32, is disposed and connect receive coils 40, 42. The varactor diode 32 provides the capacitance decoupling which is utilized to minimize or remove the mutual inductance or coupling from the RF receive coil assembly 20. To provide the proper capacitance decoupling, the measurement and control unit 30 controls a signal generator 46 to provide a signal through a high reactance network 72 to receive coil 40. The measurement and control unit 30 measures the output of an output amplifier 50 which amplifies the signal received from the receive coil 42. The RF receive coil assembly 20 includes a switch 52 to protect the RF receiver 28 during the measurement process. The RF receive coil assembly 20 further includes RF chokes 54 between the varactor diode 32 and the measurement and control unit 30 to remove any RF signals from the voltage being fed.

Figure 5:
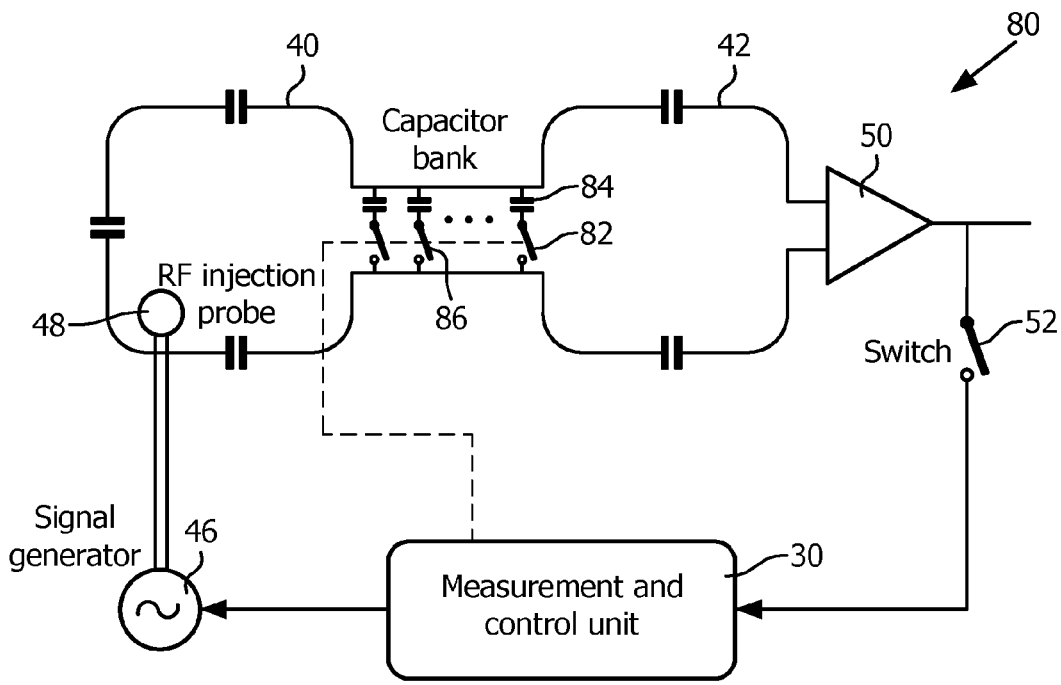
FIG. 5 is a schematic diagram of another embodiment of a RF receive coil assembly in accordance with the present application.

With reference to FIG. 5, another RF receive coil assembly 80 includes a plurality of receive coils 40, 42 which are diagrammatically illustrated. Each receive coil includes a coil segment, e.g. a loop coil, that is tuned to the resonance frequency. A decoupling circuit, e.g. a capacitor bank 82, is disposed and connect receive coils 40, 42. The capacitance bank 82 provides the capacitance decoupling which is utilized to minimize or remove the mutual inductance or coupling from the RF receive coil assembly 20 by adding or removing the number of capacitors 84 within the capacitance bank. Specifically, the capacitance bank 82 includes a plurality of capacitors 84 with each capacitor 84 including a switch 86 to add or remove the corresponding capacitor from the capacitance bank. To provide the proper capacitance decoupling, the measurement and control unit 30 controls a signal generator 46 to provide a signal through RF injection probe 48 through receive coil 40. The measurement and control unit 30 measures the output of an output amplifier 50 which amplifies the signal received from the receive coil 42. If the receive coil 42 is fully decoupled, the induced signal is not received at the output of the coil amplifier 50. If the induced signal is received at the output of the coil amplifier 50, receive coils 40, 42 are coupled and the measurement control unit 30 adjusts the number of capacitors within the capacitance bank 82. To accomplish this, the measurement and control unit 30 provides a control signal to the switches 86 within the capacitance bank 82 to add or remove capacitors 84 until the output received at the output of the coil amplifier 50 is minimized or removed. The RF receive coil assembly 20 includes a switch 52 to protect the RF receiver 28 during the measurement process.

While all of components of the MR system 8 were shown as independent components, it is to be appreciated that each of the components can be part of an integrated MR system 8. At least some of the components of the MR system 8 each include at least one processor executing computer executable instructions from at least one memory thereof. These components include the scan controller 22, gradient controller 24, measurement and control unit 30, reconstruction processor 34, and display 36. The computer executable instructions embody the functionality of the components and include the applications of the scan controller 22, gradient controller 24, measurement and control unit 30, reconstruction processor 34, and display 36. Further, at least some of the components each include a communication unit and/or at least one system bus. A communications unit provides a corresponding processor with an interface to at least one communication network, such as the communication network. A system bus allows the exchange of data between sub-components of the components. Sub-components include processors, memories, sensors, display devices, communication units, and so on.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), a field-programmable gate array (FPGA), and the like; a user input device includes one or more of a mouse, a keyboard, a touch screen display, one or more buttons, one or more switches, one or more toggles, and the like; a database includes one or more memories; and a display device includes one or more of a LCD display, an LED display, a plasma display, a projection display, a touch screen display, and the like, including 3D-capable versions of these.

Figure 6:
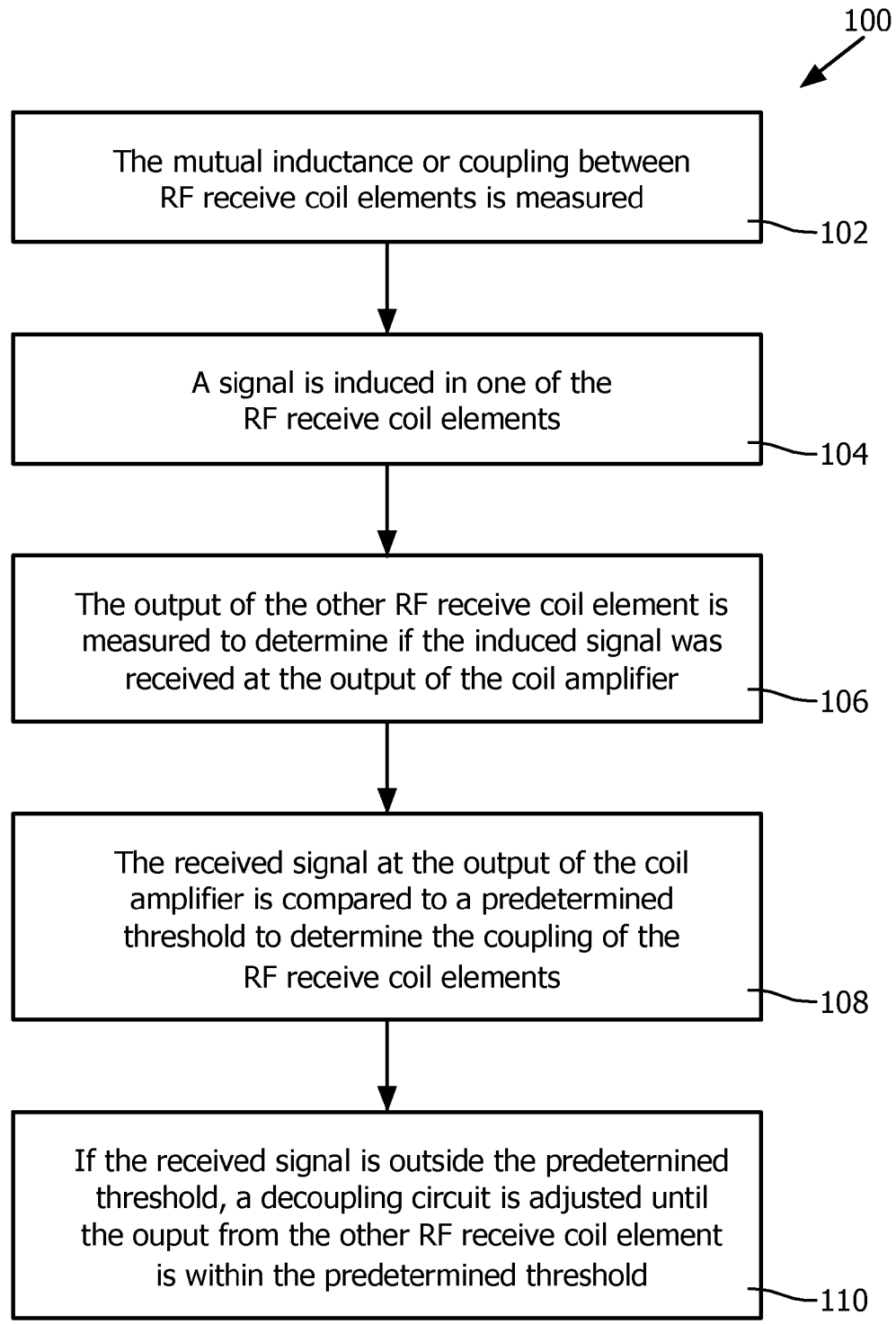
FIG. 6 is a block diagram of a method automated decoupling of coil elements according to aspects of the present application.

With reference to FIG. 6, a method 100 automated decoupling of coil elements is illustrated. In a step 102, the mutual inductance or coupling between RF receive coil elements is measured. In a step 104, a signal is induced in one of the RF receive coil elements. In a step 106, the output of the other RF receive coil element is measured to determine if the induced signal was received at the output of the coil amplifier. In a step 108, the received signal at the output of the coil amplifier is compared to a predetermined threshold to determine the coupling of the RF receive coil elements. In a step 110, if the received signal is outside the predetermined threshold, a decoupling circuit is adjusted until the output from the other RF receive coil element is within the predetermined threshold. This process is repeated after each scan or after the RF receive coil elements are moved.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:
1. A magnetic resonance system, comprising:
   a magnet which generates a static magnetic field in an examination region;
   a RF transmitter and a RF transmit coil which generates RF pulses at a magnetic frequency to excite and manipulate resonance in the examination region;
   at least one RF receive coil assembly including a plurality of RF receive coil elements configured to acquire magnetic resonance data from the examination region;
   at least one RF receiver connected to the at least one RF receive coil assembly;
   a scan controller configured to control the RF transmitter and RF receiver to perform scans;
   a measurement and control unit configured to determine mutual inductance between adjacent first and second RF receive coil elements of the plurality of RF receive coil elements and determine a control signal based on the determined mutual inductance; and
   a detuning circuit disposed between the adjacent first and second RF receive coil elements to automatically decouple the adjacent first and second RF receive coil elements in response to the control signal from the measurement and control unit;
   a scan controller (20) configured to control the RF transmitter (24) and RF receiver (26),
   wherein the detuning circuit comprises a capacitance bank including a number of capacitors and a number of switches for selectively switching in a desired number of the capacitors, each capacitor having a switch controlled by the control signal from the measurement and control unit,
   wherein the measurement and control unit is further configured to control the detuning circuit by selecting the desired number of the capacitors that minimizes the determined mutual inductance between the adjacent first and second RF receive coil elements.
2. The magnetic resonance system according to claim 1, further including:
   a signal generator controlled by the measurement and control unit which induces an input signal into the first RF receive coil element of the adjacent first and second RF receive coil elements.
3. The magnetic resonance system according to claim 2, wherein the measurement and control unit measures a output of the second RF receive coil element to determine if an induced signal was received by the second RF receive coil element in response to the input signal to the first RF receive coil element.
4. The magnetic resonance system according to claim 1, wherein a output of the second RF receive coil element is compared to a predetermined threshold.
5. The magnetic resonance system according to claim 1, wherein in response to a output of the second RF receive coil element being outside the predetermined threshold, the measurement and control unit adjusts the decoupling circuit to remove the mutual inductance between the adjacent first and second RF receive coil elements.
6. The magnetic resonance system according to claim 2, wherein the input signal to the first RF receive coil element that induces the signal in the second RF receive coil element is provided by at least one of a RF injection probe, a high resistance network, and a high reactance network.
7. A system for automated decoupling of coil elements, the system comprising:
   a first and second RF receive coil elements configured to acquire magnetic resonance data from a magnetic resonance system, wherein the first and second RF receive coil elements are adjacent to each other;

a measurement and control unit configured to determine mutual inductance between the first RF receive coil element and the second RF receive coil element output and to determine a control signal based on the determined mutual inductance; and a detuning circuit disposed between the first and second RF receive coil elements to automatically decouple the first and second RF receive coil elements in response to the control signal from the measurement and control unit; and wherein the detuning circuit comprises a capacitance bank including a number of capacitors and a number of switches for selectively switching in a desired number of the capacitors, each capacitor having a switch controlled by the control signal from the measurement and control unit, wherein the measurement and control unit is further configured to control the detuning circuit by selecting the desired number of the capacitors that minimizes the determined mutual inductance between the adjacent first and second RF receive coil elements.

8. The system according to claim 7, further including:
a signal generator controlled by the measurement and control unit configured to induce an input signal into the first RF receive coil element.

9. The system according to claim 8, wherein the measurement and control unit measures the output of the second RF receive coil element to determine if an induced signal was received by the second RF receive coil element in response to the input signal to the first RF receive coil element.

10. The system according to claim 7, wherein the output of the second RF receive coil element is compared to a predetermined threshold.

11. The system according to claim 7, wherein in response to the output of the second coil element is outside the predetermined threshold, the measurement and control unit adjusts the decoupling circuit to remove the mutual inductance between the first and second coil elements.

12. The system according to claim 8, wherein the input signal to the first RF receive coil element that induces the signal in the second RF receive coil element is provided by at least one of a RF injection probe, a high resistance network, and a high reactance network.

13. A method for automated decoupling of coil elements, the method comprising:
injecting a first signal into a first coil element;
measuring an induced signal coupled from the first coil element into a second coil element, wherein the second coil element is adjacent the first coil element;
determining by the measurement and control unit, mutual inductance between the first coil element and the second coil element;
adjusting a decoupling circuit to minimize the coupling between the first and second coil elements in response to the control signal from the measurement and control unit,
wherein the detuning circuit comprises a capacitance bank including a number of capacitors and a number of switches for selectively switching in a desired number of the capacitors, each capacitor having a switch controlled by the control signal from the measurement and control unit, and wherein the adjusting step select the desired number of the capacitors that minimizes the determined mutual inductance between the adjacent first and second coil elements.

14. The method according to claim 13, wherein the injecting act injects the first signal by at least one of a RF injection probe, a high resistance network, and a high reactance network.

15. A magnetic resonance system, including:
a magnet which generates a static magnetic field in an examination region;
a RF transmitter and a RF transmit coil which generates RF pulses at a magnetic frequency to excite and manipulate resonance in the examination region;
at least one RF receive coil assembly including a first and second coil element configured to acquire magnetic resonance data from the examination region;
at least one RF receiver connected to the at least one RF coil assembly;
a decoupling system which performs the method of claim 13; and
a scan controller configured to control the RF transmitter and RF receiver.

16. The magnetic resonance system according to claim 2, further comprising:
an output amplifier which amplifies a signal received from the second RF receive coil element responsive to the input signal into the first RF receive coil element; and
a switch connected between an output of the output amplifier and an input of the measurement and control unit,
wherein the measurement and control unit is configured to determine the mutual inductance and output the control signal after each scan.

17. The system according to claim 8, further comprising:
an output amplifier which amplifies a signal received from the second RF receive coil element responsive to the input signal into the first RF receive coil element; and
a switch connected between an output of the output amplifier and an input of the measurement and control unit,
wherein the measurement and control unit is configured to determine the mutual inductance and output the control signal after each scan.

18. The method according to claim 13, further comprising:
amplifying by an output amplifier a signal received from the second coil element responsive to the first signal into the first coil element; and
closing a switch connected between an output of the output amplifier and an input of the measurement and control unit,
wherein the determining step is performed after each scan.

* * * * *